United States Patent
Lee et al.

(10) Patent No.: US 8,759,781 B2
(45) Date of Patent: Jun. 24, 2014

(54) RADIATION IMAGING SYSTEM

(75) Inventors: Denny Lap Yen Lee, West Chester, PA (US); Hyun Suk Jang, Seongnam-si (KR)

(73) Assignee: Vieworks Co., Ltd., Gyeonggi-do (KR)

( * ) Notice: Subject to any disclaimer, the term of this patent is extended or adjusted under 35 U.S.C. 154(b) by 69 days.

(21) Appl. No.: 13/565,285

(22) Filed: Aug. 2, 2012

(65) Prior Publication Data

US 2013/0032723 A1 Feb. 7, 2013

Related U.S. Application Data

(60) Provisional application No. 61/514,089, filed on Aug. 2, 2011, provisional application No. 61/514,116, filed on Aug. 2, 2011, provisional application No. 61/514,121, filed on Aug. 2, 2011.

(51) Int. Cl.
*G01T 1/20* (2006.01)
*H01L 27/146* (2006.01)

(52) U.S. Cl.
CPC ............ *G01T 1/20* (2013.01); *H01L 27/14676* (2013.01); *H01L 27/14665* (2013.01)
USPC ........................................... 250/369

(58) Field of Classification Search
CPC ............... H01L 27/14676; H01L 27/14665; H01L 31/115; G01T 1/20; G01T 1/2018
USPC ........................................... 250/369
See application file for complete search history.

(56) References Cited

U.S. PATENT DOCUMENTS

| 5,294,509 A * | 3/1994 | Ashiya et al. ............. 430/58.05 |
| 2004/0086204 A1 * | 5/2004 | Shoji ............................ 382/312 |
| 2009/0179155 A1 * | 7/2009 | Weinberg ................. 250/370.01 |

* cited by examiner

*Primary Examiner* — Marcus Taningco
(74) *Attorney, Agent, or Firm* — Saliwanchik, Lloyd & Eisenschenk

(57) ABSTRACT

Disclosed is a radiation imaging system comprising a layer for a radiation converter; a top electrode on the layer for a radiation converter; and an array of pixel unit electrically coupled to the layer for a radiation converter; wherein, said layer for a radiation converter comprises an organic matrix comprising a charge transport material (CTM); and scintillating particles for absorbing radiation, being dispersed in the organic matrix, wherein the scintillating particles are in contact with a charge generation material (CGM).

17 Claims, 4 Drawing Sheets

RADIATION IMAGING SYSTEM

CROSS-REFERENCE TO RELATED APPLICATIONS

This application claims the benefit of U.S. Provisional Patent Application Nos. 61/514,089, filed Aug. 2, 2011, 61/514,116, filed Aug. 2, 2011, and 61/514,121, filed Aug. 2, 2011, which are hereby incorporated by reference in their entirety.

FIELD OF THE INVENTION

The present invention relates to a radiation imaging system. More particularly, the present invention relates to a radiation imaging system using a novel composition as a layer for a radiation converter which absorbs radiation and subsequently producing electrical charges proportional to the absorbed radiation.

BACKGROUND

Traditional medical diagnostic processes record X-ray image patterns on silver halide films. These systems direct an initially uniform pattern of interrogating X-ray radiation through a patient to be studied, intercept the consequently image-wise modulated pattern of X-ray radiation with an X-ray radiation intensifying screen, record the intensified pattern in a silver halide film, and chemically transform this latent radiation pattern into a permanent and visible image, called a radiogram.

Radiograms have also been produced by using layers of radiation sensitive materials to directly capture radiographic images as image-wise modulated patterns of electrical charges. Depending on the intensity of the incident X-ray radiation, electrical charges generated either electrically or optically by the X-ray radiation within a pixelized area are quantized using a regularly arranged array of discrete solid state radiation sensors. U.S. Pat. No. 5,319,206, issued to Lee et al. on Jun. 7, 1994 and assigned to E. I. du Pont de Nemours and Company, describes a system employing a layer of photoconductive material to create an image-wise modulated areal distribution of electron-hole pairs which are subsequently converted to corresponding analog pixel (picture element) values by electro-sensitive devices, such as thin-film transistors. U.S. Pat. No. 5,262,649 (Antonuk et al.) describes a system employing a layer of phosphor or scintillation material to create an image-wise modulated distribution of photons which are subsequently converted to a corresponding image-wise modulated distribution of electrical charges by photosensitive devices, such as amorphous silicon photodiodes. These solid state systems have the advantage of being useful for repeated exposures to X-ray radiation without consumption and chemical processing of silver halide films.

In systems utilizing a photoconductive material such as selenium such as the prior art described in U.S. Pat. No. 5,319,206 (FIG. 1), before exposure to image-wise modulated X-ray radiation, an electrical potential is applied to the top electrode 1 to provide an appropriate electric field. During exposure to X-ray radiation 10, electron-hole pairs (indicated as − and +) are generated in the photoconductive layer 3 in response to the intensity of the image-wise modulated pattern of X-ray radiation, and these electron-hole pairs are separated by the applied biasing electric field supplied by a high voltage power supply 12. The electron-hole pairs move in opposite directions along the electric field lines toward opposing surfaces of the photoconductive layer 3. After the X-ray radiation exposure, a charge image is stored in the storage capacitor 8 of the TFT array 7A. This image charge is then readout by an orthogonal array of thin film transistors 7 and charge integrating amplifiers 6. This type of direct conversion system has the distinct advantage of maintaining high spatial resolution more or less independent with the thickness of the x-ray converting photoconductive layer. However, currently, only very limited number of direct converting photoconductors can be used for commercial products. The most popular and technical matured material is amorphous selenium that has good charge transport properties for both holes and electrons generated by the x-ray. However, selenium having an atomic number of 34 has only good x-ray absorption in the low energy range, typically below 30 Kev. For higher energy x-ray, the absorption coefficient of selenium becomes smaller and smaller and therefore thicker and thicker layers of selenium are required for adequate x-ray capture. Since the complication and difficulty of fabrication of good imaging quality amorphous selenium is a strong function of the selenium thickness, successful x-ray imaging product so far are limited to lower energy x-ray application such as mammography, low energy x-ray crystallography, low energy non-destructive testing.

In systems employing a layer of phosphor or scintillation material to create an image-wise modulated distribution of photons which are subsequently converted to a corresponding image-wise modulated distribution of electrical charges by photosensitive devices, such as amorphous silicon photodiodes, the scintillation generated by the absorbed x-ray may undergo multiple scattering and therefore spreading before being detected by the photo-sensitive imaging device. Phosphor types can be chosen to contain higher atomic number molecules such as Gadolinium (atomic number 64), cesium (atomic weight 133), iodine (53), Lanthanum (57), Terbium (57), Barium (56) and etc. for higher x-ray absorption coefficient. However, because of the scattering of the scintillation, this type of indirect conversion x-ray detector has a high point spread function resulting with a lower spatial resolution in compared to the direct conversion type such as selenium.

It is therefore desirable to design a radiation imaging system that has adequate radiation absorption over a wide radiation energy range as well as retaining high spatial resolution regardless of the thickness of the radiation absorption media.

BRIEF SUMMARY

An embodiment is directed a radiation imaging system comprising: a layer for a radiation converter; a top electrode on the layer for a radiation converter; and an array of pixel unit electrically coupled to the layer for a radiation converter; wherein, said layer for a radiation converter comprises an organic matrix comprising a charge transport material (CTM); and scintillating particles for absorbing radiation, being dispersed in the organic matrix, wherein the scintillating particles are in contact with a charge generation material (CGM).

The charge generation material (CGM) in contact with the scintillating particles may be present in the form of a mixture with the charge transport material (CTM) in the organic matrix.

The scintillating particles may be coated with the charge generation material (CGM) in part or in whole surface.

The thickness of the charge generation material coated onto the scintillating particles may be sufficient to absorb more than about 20% of the scintillating light emitted from the scintillating particles.

The scintillating particles may include, but are not limited to, Gadolinium Oxysulfide (GOS), Cesium Iodide (CO), Sodium Iodide (NaI), bismuth germanate (BGO), Zinc Sulfide (ZnS), Cadmium tungstate ($CdWO_4$ or CWO), LYSO ($Lu_{1.8}Y_{0.2}SiO_5(Ce)$)) and the like.

The scintillating particles may be doped with dopant including Europium (Eu), terbium (Tb), Praseodymium (Pr) and Lithium (Li) and combinations thereof.

The emission spectrum of the doped scintillating particles may be in the range of the absorption spectrum of the CGM material.

The charge generation material may include, but are not limited to, quinolines, porphyrins, quinacridones, dibromo anthanthrone pigments, squalilium dyes, perylene diamines, perinone diamines, polynuclear aromatic quinones, pyrylium salts, thiopyrylium salts, azo pigments, triphenylmethane type dyes, selenium, oxyvanadium phthalocyanine, chloroaluminum phthalocyanine, copper phthalocyanine, oxytitanium phthalocyanine, chloroaluminum phthalocyanine, hydroxygallium phthalocyanine, magnesium phthalocyanine, metal-free phthalocyanine, indigo type pigments. These charge generation material may be used alone or in a combination of two or more kinds thereof.

The charge transport material may include, but are not limited to, 4,4'-TPD (Triphenylamine Dimer), 9-Dicyanomethylene-2,4,7-trinitrofluorene, N,N'-Di(naphthalene-1-yl)-N,N'-di(4-methyl-phenyl)-benzidine, N,N'-Di(naphthalene-2-yl)-N,N'-di(3-methyl-phenyl)-benzidine, 4,4'-(1,2-Ethanediylidene)-bis(2,6-dimethyl-2,5-cyclohexadien-1-one), 2-(1,1-Dimethylethyl)-4-[3-(1,1-dimethylethyl)-5-methyl-4-oxo-2,5-cyclohexa-dien-1-ylidene]-6-methyl-2,5-cyclohexadien-1-one, N,N'-Di(naphthalen-1-yl)-N,N'-di(3-methyl-phenyl)-benzidine, Poly(3-octylthiophene-2,5-diyl), Poly(3-decylthiophene-2,5-diyl), N-Biphenylyl-N-phenyl-N-(3-methylphenyl)-amine, 4-N,N-Bis(4-methylphenyl)-amino-benzaldehyde-N,N-diphenylhydrazone, p-Diphenylaminobenzaldehyde-N-phenyl-methyl-hydrazone, N,N'-diphenyl-N,N'-bis(3-hydroxyphenyl)-1,1'-biphenyl-4,4'-diamine, N,N'-diphenyl-N,N'-bis(3-methylphenyl)-1,1'-biphenyl-4,4'-diamine, N,N,N'N'-tetra(4-methylphenyl)-(1,1'-biphenyl)-4,4'-diamine, 4,4'-(3,4-dimethylphenylazanediyl)bis(4,1-phenylene)dimethanol, N,N'-bis(3-methylphenyl)-N,N'-bis(4-n-butylphenyl)-1,1'-terphenyl-4,4-diamine. These charge transport material may be used alone or in a combination of two or more kinds thereof.

The weight ratio of CGM to CTM may be about 1:99 to about 95:5.

The average diameter of the scintillating particles may be in the range of about 1 to about 100 µm.

The volume percentage of the scintillating particles in the organic matrix may be about 10 vol % to about 95 vol %.

The radiation may be at least one selected from said group consisting of X-ray, gamma-ray, and ionization radiation.

The layer for a radiation converter may have a thickness of about 5 µm to about 2000 µm.

The radiation imaging system may further comprise a charge injection blocking layer between the layer for a radiation converter and the top electrode.

The array of pixel unit may comprise a charge collection electrode for collecting a charge signal in a pixel area of the layer for a radiation converter, a signal storage capacitor connected to the charge collection electrode for storing the charge signal collected by the charge collection electrode and a transistor connected to the charge collection electrode for converting the charge signal on the charge collection electrode into a voltage signal and transferring the voltage signal to a signal line The size of the scintillating particles may be smaller than pixel size of the radiation imaging detector.

BRIEF DESCRIPTION OF THE DRAWINGS

The above and other features of the present disclosure will become apparent from the detailed description of the following embodiments in conjunction with the accompanying drawings.

DETAILED DESCRIPTION

Figure 1:
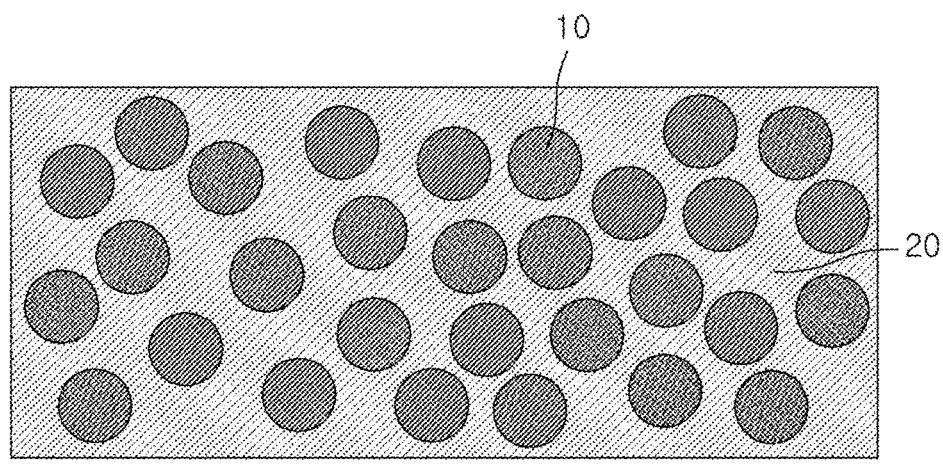
FIG. 1 is a schematic view illustrating a layer for a radiation converter according to an exemplary embodiment.

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

A description of details apparent to those skilled in the art will be omitted herein for clarity.

An embodiment is directed to a radiation imaging system. The radiation imaging system comprises a layer for a radiation converter; a top electrode on the layer for a radiation converter; and an array of pixel unit electrically coupled to the layer for a radiation converter; wherein, said layer for a radiation converter comprises an organic matrix and scintillating particles for absorbing radiation.

The scintillating particles are dispersed in the organic matrix.

The scintillating particles are in contact with a charge generation material (CGM). For example, the scintillating particles may be coated with the charge generation material (CGM) in part or in whole surface.

The term "contact" as used herein means to make a state in which the scintillating particles and the charge generation material (CGM) are in close contact-with each other. In one embodiment, the whole surface of the scintillating particles may be surrounded by the charge generation material (CGM). In another embodiment, the scintillating particles may be coated with the charge generation material (CGM) in part. In another embodiment, the scintillating particles may be in contact with the charge generation material (CGM) being present in the form of a mixture with the charge transport material (CTM) in the organic matrix.

The scintillating particles may be dispersed in a continuous phase of the organic matrix.

FIG. 1 is a schematic view illustrating a layer for a radiation converter according to an exemplary embodiment. As shown in FIG. 1, the scintillating particles 10 may be dispersed in the organic matrix 20.

Figure 2:
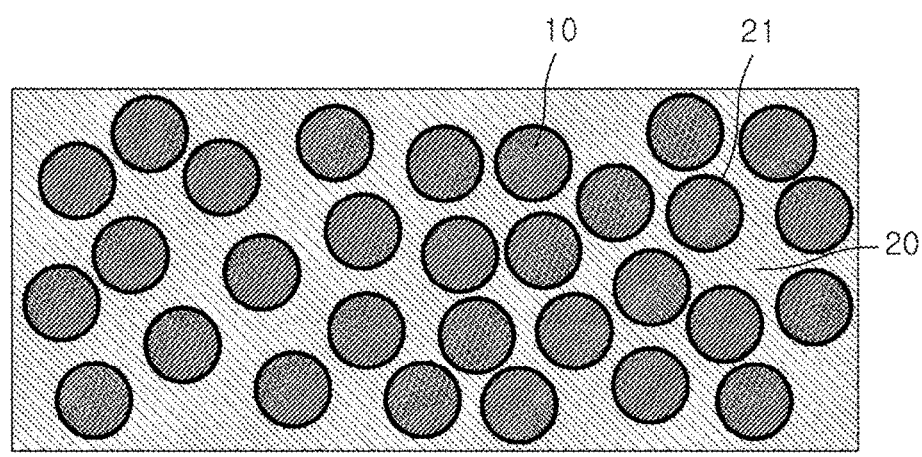
FIG. 2 is a schematic view illustrating a layer for a radiation converter according to another exemplary embodiment.

FIG. 2 is a schematic view illustrating a layer for a radiation converter according to another exemplary embodiment. As shown in FIG. 2, the scintillating particles 10 coated with a charge generation material (CGM) 21 may be dispersed in the organic matrix 20.

The scintillating particles absorb radiation and generate a light pulse with intensity proportional to the absorbed energy. The scintillating particles having high atomic number will be more suitable for effectively absorbing radiation of higher energy.

The scintillating particles may include, but are not limited to, Gadolinium Oxysulfide (GOS), Cesium Iodide (CsI), Sodium Iodide (NaI), bismuth germanate (BGO). Zinc Sulfide (ZnS), Cadmium tungstate ($CdWO_4$ or CWO), LYSO ($Lu_{1.8}Y_{0.2}SiO_5(Ce)$). These scintillating particles may be used alone or in a combination of two or more kinds thereof. Among them, Gadolinium Oxysulfide (GOS) is preferred.

The size of the scintillating particles may be smaller than pixel size of the radiation imaging detector. For examples, the average diameter of the scintillating particles may be in the range of about 1 to about 100 μm, e.g., about 3 to about 50 μm. Within the range, the radiation imaging system may have good resolution and low noise.

In an implementation, the scintillating particles may be doped with dopants. The dopants may include, but are not limited to, Europium (Eu), Terbium (Tb), Praseodymium (Pr) and Lithium (Li). These dopants may be used alone or in a combination of two or more kinds thereof. The scintillation spectrum of each scintillating particles can be different with different doping and proper type can be chosen to match the absorption spectrum of the charge generation material. For example, the emission spectrum of the doped scintillating particles may be in the range of the absorption spectrum of the charge generation material (CGM). In an implementation, when the scintillating particles are Gadolinium Oxysulfide (GOS) and the charge generation material (CGM) is phthalocyanine based compound, the dopant may be chosen from Eu, because the emission spectrum of the Eu doped scintillator matches the absorption spectrum of the phthalocyanine based charge generation material (CGM).

The organic matrix may be organic photoconductor (OPC) material which comprises a charge transport material (CTM). In an embodiment, the organic matrix may be a charge transport material (CTM) only. In another embodiment, the organic matrix may be a mixture of a charge generation material (CGM) and a charge transport material (CTM).

The charge generation material (CGM) may be electrical contact with the charge transport material (CTM) in the organic matrix.

When the charge generation material is coated onto the scintillating particles, the thickness of the charge generation material coated onto the scintillating particles may be sufficient to absorb more than about 20%, preferably 30% or more of the scintillating light emitted from the scintillating particles.

The charge generation material may include, but are not limited to, quinolines, porphyrins, quinacridones, dibromo anthanthrone pigments, squalllium dyes, perylene diamines, perinone diamines, polynuclear aromatic quinones, pyrylium salts, thiopyrylium salts, azo pigments, triphenylmethane type dyes, selenium, oxyvanadium phthalocyanine, chloroaluminum phthalocyanine, copper phthalocyanine, oxytitanium phthalocyanine, chloroaluminum phthalocyanine, hydroxygallium phthalocyanine, magnesium phthalocyanine, metal-free phthalocyanine, indigo type pigments. These charge generation material may be used alone or in a combination of two or more kinds thereof. For example, 2,9-Dibenzyl-anthra[2,1,9-def:6,5,10-d'e'f']diisoquinoline-1,3,8,10-tetrone, Phthalocyanine Iron (II) complex, 8,9,18,19-Tetrachloro-bisbenzimidazo(2,1-a:1', 2'-b')anthra(2,1,9-def: 6,5,10, d'e'f')diisoquinoline-6,16-dione (mixture w/ cis-isomer), 5,10,15,20-Tetraphenylporphine Vanadyl (IV) oxide, 2,9-Di(tridec-7-yl)-anthra[2,1,9-def:6,5,10-d'e'f']diisoquinoline-1,3,8,10-tetrone, 2,9-Di(pent-3-yl)anthra[2,1, 9-def:6,5,10-d'e'f']diisoquinoline-1,3,8,10-tetrone, 2,9-Dibenzyl-5,6,12,13-tetrachloro-anthra(2,1,9-def:6,5,10-d'e'f')diisoquinoline-1,3,8,10-tetrone, 2,9-Dipropyl-anthra [2,1,9-def:6,5,10-d'e'f']diisoquinoline-1,3,8,10-tetrone, 2,9-Dimethyl-anthra[2,1,9-def:6,5,10-d'e'f']diisoquinoline-1,3, 8,10-tetrone, 2,9-Dibenzyl-5,6,12,13-tetrachloro-anthra(2,1, 9-def:6,5,10-d'e'f')diisoquinoline-1,3,8,10-tetrone, Phthalocyanine lead complex, Titanium (IV) oxide phthalocyanine, 2% dispersion with 2% BM5 (Polyvinylbutyral) binding agent in 96% 1,3-dioxolane, 1-(4-Dimethylaminophenyl)-3-(4-dimethylimmoniumcyclohexa-2,5-dien-1-ylidene)-2-oxocyclobuten-4-olate, Indium (III) phthalocyanine chloride, 1-(2.5-Dimethyl-pyrrol-3-yl)-3-(2,5-dimethyl-pyrrolium-3-ylidene)-cyclobuten-2-one-4-olate, 1-(1-Benzyl-quinolin-4-ylidenemethyl)-3-(1-benzyl-qunolinium-4-yl-methylene)-2-oxo-cyclobutene-4-olate, 5,10,15, 20-Tetraphenylporphine (metal free), 1-(4-Dimethylamino-2-hydroxy-phenyl)-3-(4-dimethylimmonium-2-hydroxy-cyclohexa-2,5-dien-1-ylidene)-2-oxo-cyclobuten-4-olate, Bisbenzimidazo[2,1-a:2',1'-a']anthra[2,1,9-def:6,5,10-d'd'f'] diisoquinoline-10,21-dione (Mixture with cis-isomer), Titanium (IV) oxide phthalocyanine, 5,10,15,20-Tetraphenylporphine cobalt (II), 1-(3,5-Dimethyl-4-ethyl-pyrrol-2-yl)-3-(3, 5-dimethyl-4-ethyl-pyrrolium-2-ylidene)-cyclobuten-2-one-4-olate, Bisimidazo[2,1-a:2',1']anthra[2,1,9-def:6,5,10-d'e'f']diisoquinoline-dione (mixture with cis-isomer), 2,9-Di (2-methoxyethyl)anthra[2,1,9-def:6,5,10-d'e'f'] diisoquinoline-1,3,8,10-tetrone, Iron (III) chloride tetraphenylporphine, Azulenylium, dihydro-3-[2-hydroxy-3-(5-isopropyl-3,8-dimethyl-1-azulenyl)-4-oxo-2-cyclobuten-1-ylidene]-7-isopropyl-1,4-dimethyl, hydroxide and the like.

The charge transport material may include, but are not limited to, 4,4'-TPD (Triphenylamine Dimer), 9-Dicyanomethylene-2,4,7-trinitrofluorene, N,N'-Di(naphthalene-1-yl)-N,N'-di(4-methyl-phenyl)-benzidine, N,N'-Di(naphthalene-2-yl)-N,N'-di(3-methyl-phenyl)-benzidine, 4,4'-(1,2-Ethanediylidene)-bis(2,6-dimethyl-2,5-cyclohexadien-1-one), 2(1,1-Dimethylethyl)-4-[3-(1,1-dimethylethyl)-5-methyl-4-oxo-2,5-cyclohexa-dien-1-ylidene]-6-methyl-2,5- cyclohexadien-1-one, N,N'-Di(naphthalen-1-yl)-N,N'-di(3-methyl-phenyl)-benzidine, Poly(3-octylthiophene-2,5-diyl), Poly(3-decylthiophene-2,5-diyl), N-Biphenylyl-N-phenyl-N-(3-methylphenyl)-amine, 4-N,N-Bis(4-methylphenyl)-amino-benzaldehyde-N,N-diphenylhydrazone, p-Dipheny-laminobenzaldehyde-N-phenyl-methyl-hydrazone, N,N'-diphenyl-N,N'-bis(3-hydroxyphenyl)-1,1'-biphenyl-4,4'-diamine, N,N'-diphenyl-N,N'-bis(3-methylphenyl)-1,1'-biphenyl-4,4'-diamine, N,N,N'N'-tetra(4-methylphenyl)-(1,1'-biphenyl)-4,4'-diamine, 4,4'-(3,4-dimethylphenylazanediyl)bis(4,1-phenylene)dimethanol, N,N'-bis(3-methylphenyl)-N,N'-bis(4-n-butylphenyl)-1,1'-terphenyl-4,4-diamine. These charge transport material may be used alone or in a combination of two or more kinds thereof.

The weight ratio of CGM to CTM may be about 1:99 to about 95:5, e.g., about 10:90 to about 80:20. Within the range, the radiation imaging system may have good resolution and low noise.

The volume percentage of the scintillating particles in the organic matrix may be about 10 vol % to about 95 vol %, e.g., about 15 vol % to about 80 vol %. Within the range, the radiation imaging system may have good resolution and low noise. For example, the volume percentage of the scintillating particles in the organic matrix may be about 20 vol % to about 65 vol %.

Figure 3:
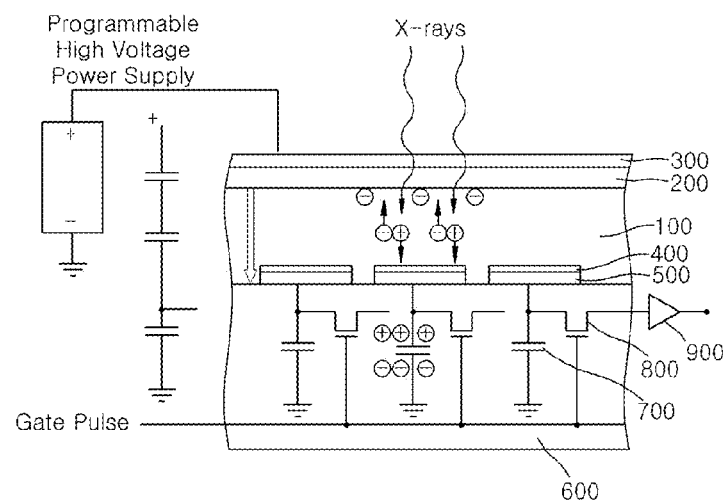
FIG. 3 is a schematic view illustrating a radiation imaging system according to an exemplary embodiment.

FIG. 3 is a schematic view illustrating a radiation imaging system according to an exemplary embodiment. The radiation imaging system comprises the foregoing layer 100; a top electrode 300 on the layer for a radiation converter; and an array of pixel unit electrically coupled to the layer for a radiation converter.

The radiation may be at least one selected from said group consisting of X-ray, gamma-ray, and ionization radiation. The ionization radiation may include all radiation that penetrates material and produces light in scintillation material. For example, the ionization radiation may include alpha-ray, beta-ray, neutron and the like.

The layer 100 for a radiation converter may be prepared by mixing the organic matrix and the scintillating particles to prepare a composition and coating the composition onto an image charge collection device.

In an embodiment, the composition may be prepared by coating a charge generation material (CGM) onto a surface of scintillating particles; and dispersing the scintillating particles coated with the charge generation material into a organic matrix comprising a charge transport material (CTM).

In another embodiment, the composition may be prepared by mixing a charge generation material (CGM) and a charge transport material (CTM) to prepare a organic matrix; and dispersing scintillating particles into the organic matrix.

A binder resin can be added into the organic matrix. Examples of the binder resin may include, but are not limited to, styrene-based resin, polyolefin, acryl-based resin, vinyl acetate resin, epoxy resin, polyurethane resin, phenol resin, polyester resin, alkyd resin, polycarbonate resin, silicone resin, melamine resin, and the like.

The binder resin may be dissolved by a solvent such as aromatic solvent, alcohol, methylene chloride, 1,2-dichloro-ethane, methyl ethyl ketone, cyclohexane, ethyl acetate, butyl acetate, methyl cellosolve, ethyl cellosolve, tetrahydrofuran, 1,4-dioxane, pyridine, diethyl amine, and the like.

For dispersing the dispersing the scintillating particles in the organic matrix, an ultrasonic dispersing apparatus, a ball mill, a sand grinder and a homomixer may be usable.

The layer 100 may have a thickness of about 5 µm to about 2000 µm, e.g., about 10 µm to about 1000 µm. The layer 100 may be deposited on top of an image charge collection device.

The radiation imaging system may further comprise a charge injection blocking layer 200 between the layer for a radiation converter and the top electrode.

The array of pixel unit may comprise a charge collection electrode 500 for collecting a charge signal in a pixel area of the layer for a radiation converter, a signal storage capacitor 700 connected to the charge collection electrode for storing the charge signal collected by the charge collection electrode and a transistor 800 connected to the charge collection electrode for converting the charge signal on the charge collection electrode into a voltage signal and transferring the voltage signal to a signal line In an embodiment, the radiation imaging system can be prepared beginning with a commercially available thin film transistor panel which comprises a substrate 600, signal storage capacitors 700 transistors 800 and charge amplifier 900. Commercially available panels used in liquid crystal displays may be a convenient starting point for building the thin film transistor panel. A charge collection electrode 500 may be formed on the thin film transistor panel. Over the surface of the charge collection electrode 500 there may be applied an electron blocking layer 400. The electron blocking layer 400 may be preferably provided by an aluminum oxide. The layer for a radiation converter 100 of the present invention may be coated over the electron blocking layer 10. The charge injection blocking layer 200 and top electrode 300 may be formed on the layer for a radiation converter 100.

Upon the absorption of radiation by the scintillating particles, the scintillating light generated may be absorbed by the immediately adjacent CGM material and may be converted locally to electrical charges. Under a bias applied electrical field, these charges are separated and transported by the CTM material in the matrix to a top and bottom interface and collected by a pixel electrode of the imaging system such as a thin film transistor (TFT) array.

The scintillation decay time and afterglow properties can also be chosen to match the requirement of an imaging system, such as imaging frame rate, image integration time and so forth. In an embodiment, the light absorption coefficient of a phthalocyanine based CGM material may match the scintillating spectrum of Europium doped GOS. Scintillating light may be absorbed by the surrounding CGM material in a very short distance (such as 0.01-10 microns). CGM may generate electrical charges immediately adjacent to the scintillating particle where the radiation is absorbed.

A scintillating light of conventional scintillation imaging detectors needs to travel a long distance of typically hundreds of microns before reaching the light to electrical charge means of photo diodes. Along this long optical path; the scintillation light of conventional scintillation imaging detectors may undergo many scattering inside the scintillation material and resulted with image sharpness degradation.

On the other hand, the layer of the present invention may convert the scintillating light to electrical charges locally before the light is substantial scattered. The electrical charges are then directed by the electrical field in the CTM material to the respective image charge electrode and therefore high spatial image resolution can be retained. The image qualities obtained from the radiation imaging detector of the present invention may be comparable to those produced from direct conversion semiconductor such as selenium. In addition to the high image spatial quality, the radiation absorption efficiency of the layer of the present invention may be selectable from a wide range of scintillating material with different atomic number and particle sizes.

The layer of the present invention may be coated onto a charge readout system such as thin film transistor (TFT) to form a layer for a radiation converter similar to the TFT array described in U.S. Pat. No. 5,319,206, issued to Lee et al. on Jun. 7, 1994, which is incorporated by reference herein in its entirety. An upper electrode may be then deposited on the layer for a radiation converter. A bias voltage may be applied between the upper electrode and the TFT current return plane producing a uniform electric field in the layer for a radiation converter. During imaging, impinging radiation that has passed through an object such as a human body may be absorbed by the layer for a radiation converter, producing light with intensity proportional to the intensity of the absorbed radiation energy. The majority of this scintillating light will be absorbed by the surrounding CGM and in turn may generate charges of electron-hole pairs proportional to the intensity of the scintillation. Under the electric field produced by the bias electrode, one polarity of charges will be driven to a charge collector in the TFT and the opposite polarity of charges will be driven to a bias electrode. This structure may be similar to a direct conversion radiation imaging detector such as selenium detector described U.S. Pat. No. 5,319,206 with the charge conversion selenium layer. Since the majority of lights may be absorbed by the CGM coating or immediately adjacent to the scintillating material, charges generated by absorption of radiation in this process may be very local to the radiation absorption material.

With the bias electric field, these charges may be driven directly to the charge collecting pixel immediately below the point of radiation interaction with a spreading no larger than the size of the scintillation particles which can be much smaller than the TFT pixel size. Unlike the indirect conversion detector using just GOS or cesium iodide scintillating material, very little scintillating light may be spread beyond the radiation interaction point and therefore the spatial resolution may be retained similar to the direct conversion detector such as selenium on TFT.

Details of the present disclosure will be explained in more detail with reference to the following examples and preparative examples. Embodiments that are not included herein will be readily recognized and appreciated by those skilled in the art, and an explanation thereof is omitted.

EXAMPLES

Figure 4:
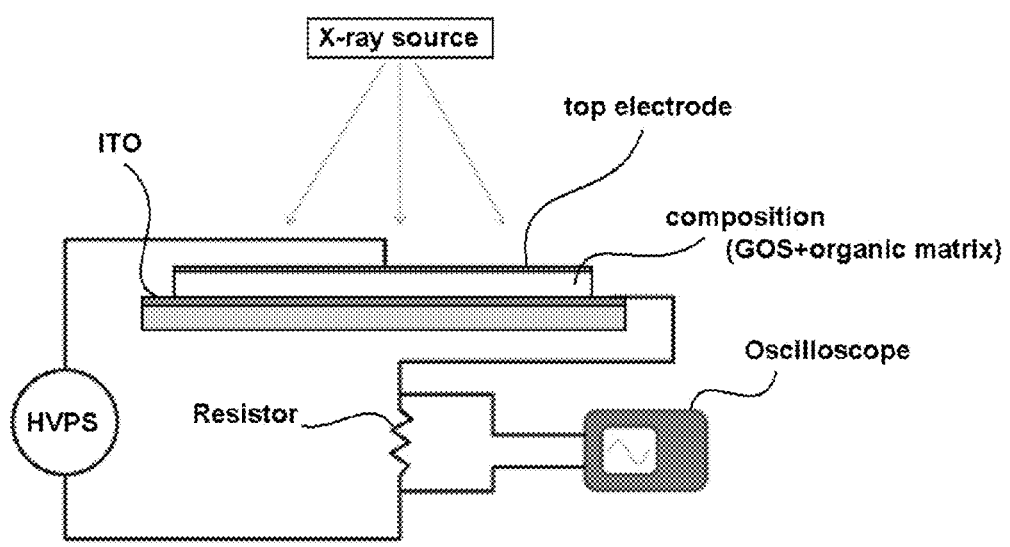
FIG. 4 is a schematic of an experimental setup used in Example.

Methylene chloride and toluene are mixed with 10:1 weight ratio to prepare a solution. Then, 2% weight of oxytitanium phthalocyanine having the chemical formula 1 as CGM, 2% weight of 4,4'-TPD (Triphenylamine Dimer) having the chemical formula 2 as CTM, 2% weight of Polycarbonate polymer are added to the solution to obtain a mixture. The weight ratio of CGM, CTM and Polycarbonate is 1:1:1. 20 g of Europium doped GOS powder having a diameter of 4 μm is added to 4 ml of CGM/CTM mixture plus 0.54 ml of toluene to prepare a composition. The composition is then coated onto an indium tin oxide (ITO) bottom electrode using a doctor blade with a thickness of 500 μm. After 48 hours of curing at a temperature of 50° C., a conductive top electrode is coated to the top surface of the composition. A bias voltage is applied to the top electrode of the sample and the ITO bottom electrode is connected to a load resistor R with return circuit to the high voltage power supply. An oscilloscope probe is connected across the load resistor R as shown in FIG. 4.

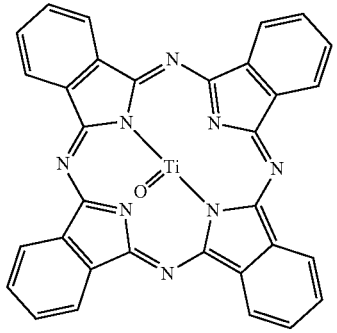

[chemical formula 1]

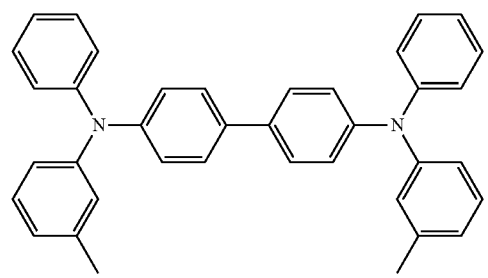

[chemical formula 2]

Figure 5:
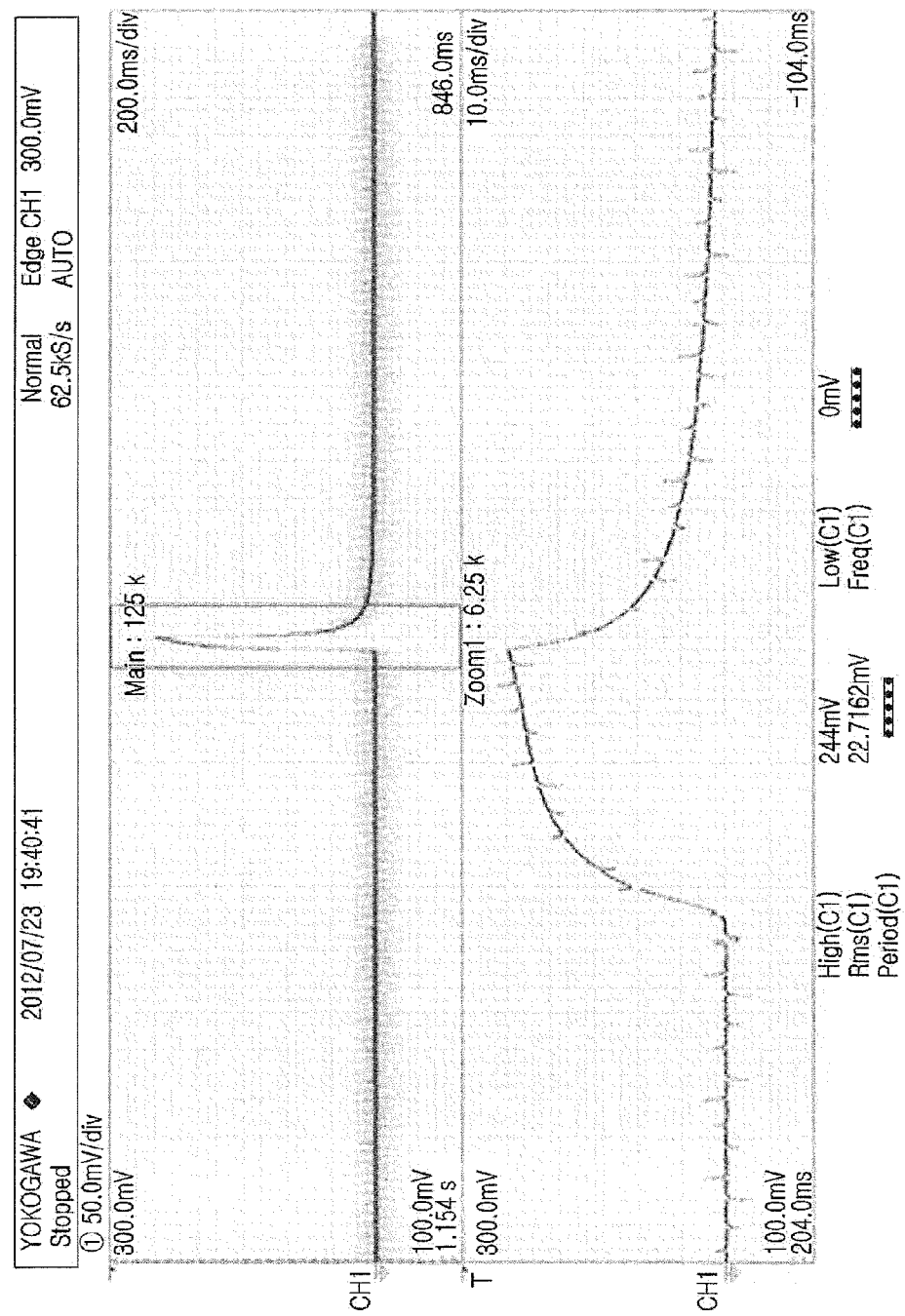
FIG. 5 is an oscilloscope signal when 1,000 volts of positive bias is applied in Example.
Figure 6:
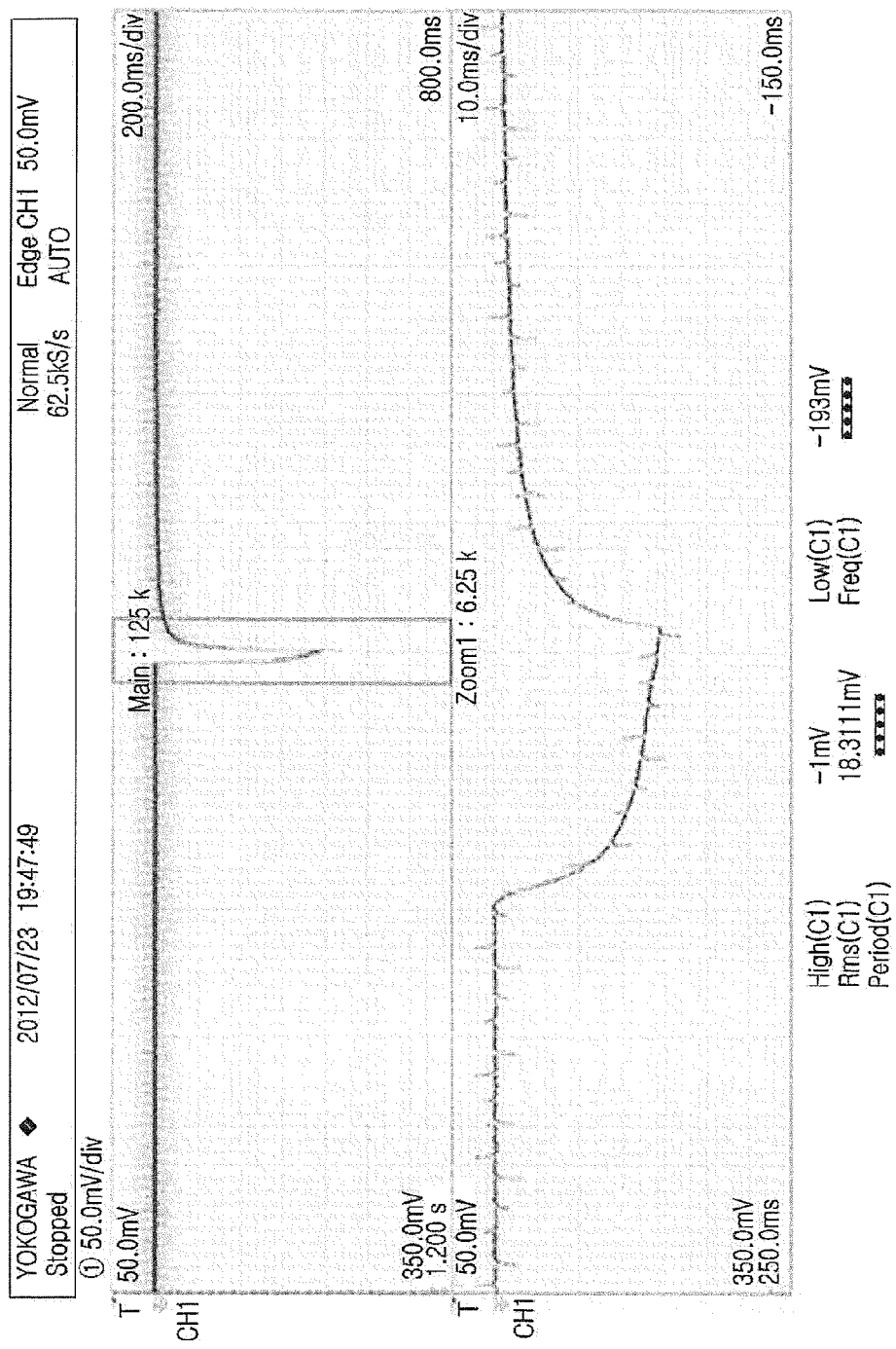
FIG. 6 is an oscilloscope signal when 1,000 volts of negative bias is applied in Example.

Upon exposure of x-ray from a source of 70 KVP, 100 mA, and 20 milliseconds, an oscilloscope signal is shown in FIG. 5 when 1,000 volts of positive bias is applied. FIG. 6 shows the oscilloscope signal when 1,000 volts of negative bias is applied. When a two dimensional thin film transistor (TFT) array is used in place of the ITO glass, the charge signal produced by the x-ray exposure will be collected by each individual pixel element and an x-ray image will be formed.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:
1. A radiation imaging system comprising:
 a) a layer for a radiation converter;
 b) a top electrode on the layer for a radiation converter; and
 c) an array of pixel unit electrically coupled to the layer for a radiation converter;
 wherein, said layer for a radiation converter comprises an organic matrix comprising a charge transport material (CTM); and scintillating particles for absorbing radiation, being dispersed in the organic matrix, wherein the scintillating particles are in contact with a charge generation material (CGM).

2. The radiation imaging system as claimed in claim 1, wherein the charge generation material (CGM) in contact with the scintillating particles is present in the form of a mixture with the charge transport material (CTM) in the organic matrix.

3. The radiation imaging system as claimed in claim 1, wherein the scintillating particles are coated with the charge generation material (CGM) in part or in whole surface.

4. The radiation imaging system as claimed in claim 3, wherein the thickness of the charge generation material coated onto the scintillating particles is sufficient to absorb more than about 20% of the scintillating light emitted from the scintillating particles.

5. The radiation imaging system as claimed in claim 1, wherein the scintillating particles include at least one of Gadolinium Oxysulfide (GOS), Cesium Iodide (CsI), Sodium Iodide (NaI), bismuth germanate (BGO), Zinc Sulfide (ZnS), Cadmium tungstate ($CdWO_4$ or CWO), LYSO ($Lu_{1.8}Y_{0.2}SiO_5(Ce)$).

6. The radiation imaging system as claimed in claim 1, wherein the scintillating particles is doped with dopant including at least one of Europium, Terbium (Tb), Praseodymium (Pr) and Lithium (Li).

7. The radiation imaging system as claimed in claim 6, wherein the emission spectrum of the doped scintillating particles is in the range of the absorption spectrum of the CGM material.

8. The radiation imaging system as claimed in claim 1, wherein the charge generation material is at least one of oxytitanium phthalocyanine, quinolines, porphyrins, quinacridones, dibromo anthanthrone pigments, squalilium dyes, perylene diamines, perinone diamines, polynuclear aromatic quinones, pyrylium salts, thiopyrylium. salts, azo pigments, triphenyhnethane type dyes, selenium, oxyvanadiurn phthalocyanine, chloroaluminum phthalocyanine, copper phthalocyanine, oxytitanium phthalocyanine, chlorogallium phthalocyanine, hydroxygalliurn phthalocyanine, magnesium phthalocyanine, metal-free phthalocyanine, indigo type pigments, and combinations thereof.

9. The radiation imaging system as claimed in claim 1, wherein the charge transport material is at least one of 4,4'-TPD (Triphenylamine Dimer), 9-Dicyanomethylene-2,4,7-trinitrofluorene, N,N'-Di(naphthalene-1-yl)-N,N'-di(4-methyl-phenyl)-benzidine, N,N'-Di(naphthalene-2-yl)-N,N'-di(3-methyl-phenyl)-benzidine, 4,4'-(1,2-Ethanediylidene)-bis(2,6-dimethyl-2,5-cyclohexadien-1-one), 2-(1,1-Dimethylethyl)-4-[3-(1,1-dimethylethyl)-5-methyl-4-oxo-2,5-cyclohexa-dien-1-ylidene]-6-methyl-2,5-cyclohexaidene-1-one, N,N'-di(naphthalen-1-yl)-N,N'-di(3-methyl-phenyl)-benzidine, Poly(3-octylthiophene)-2,5-diyl), Poly(3-decylthiophene-2,5-diyl), N-Biphenylyl-N-phenyl-N-(3-methylphenyl)-amine, 4-N,N-Bis(4-methylphenyl)-amino-benzaldehyde-N,N-diphenylhydrazone, p-Diphenylaminobenzaldehyde-N-phenyl-methyl-hydrazone, N,N'-diphenyl-N,N'-bis(3-hydroxyphenyl)-1,1'-biphenyl-4,4'-diamine, N,N'-diphenyl-N,N'-bis(3-methylphenyl)-1,1'-biphenyl-4,4'-diamine, N,N,N',N'-tetra(4-methylphenyl)-(1,1'-biphenyl)-4,4'-diamine, 4,4'-(3,4-dimehylphenylazanediyl)bis(4,1-phenylene)dimethanol, N,N'-bis(3-methylphenyl)-N,N'-bis(4-n-butylphenyl)-1,1'-terphenyl-4,4-diamine and combinations thereof.

10. The radiation imaging system as claimed in claim 1, wherein the weight ratio of CGM to CTM is about 1:99 to about 95:5.

11. The radiation imaging system as claimed in claim 1, wherein the average diameter of the scintillating particles is in the range of about 1 to about 100 μm.

12. The radiation imaging system as claimed in claim 1, wherein the volume percentage of the scintillating particles in the organic matrix is about 10 vol. % to about 95 vol %.

13. The radiation imaging system as claimed in claim 1, wherein the radiation is at least one selected from said group consisting of X-ray, gamma-ray, and ionization radiation.

14. The radiation imaging system as claimed in claim 1, wherein the layer for a radiation converter has a thickness of about 5 μm to about 2000 μm.

15. The radiation imaging system as claimed in claim 1 further comprising a charge injection blocking layer between the layer for a radiation converter and the top electrode.

16. The radiation imaging system as claimed in claim 1, wherein the array of pixel unit comprises a charge collection electrode for collecting a charge signal in a pixel area of the layer for a radiation converter, a signal storage capacitor connected to the charge collection electrode for storing the charge signal collected by the charge collection electrode and a transistor connected to the charge collection electrode for converting the charge signal on the charge collection electrode into a voltage signal and transferring the voltage signal to a signal line.

17. The radiation imaging system as claimed in claim 1, wherein the size of the scintillating particles is smaller than pixel size of the radiation imaging detector.

* * * * *